US007990711B1

(12) United States Patent
Andry et al.

(10) Patent No.: US 7,990,711 B1
(45) Date of Patent: Aug. 2, 2011

(54) DOUBLE-FACE HEAT REMOVAL OF VERTICALLY INTEGRATED CHIP-STACKS UTILIZING COMBINED SYMMETRIC SILICON CARRIER FLUID CAVITY AND MICRO-CHANNEL COLD PLATE

(75) Inventors: Paul S. Andry, Yorktown Heights, NY (US); Thomas J. Brunschwiler, Thalwil (CH); Evan G. Colgan, Chestnut Ridge, NY (US); John H. Magerlein, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/711,455

(22) Filed: Feb. 24, 2010

(51) Int. Cl.
*H05K 7/20* (2006.01)

(52) U.S. Cl. ........ 361/699; 257/714; 257/712; 165/80.4

(58) Field of Classification Search ........................ None
See application file for complete search history.

(56) References Cited

U.S. PATENT DOCUMENTS 5,199,165 A 4/1993 Crawford et al.
5,380,956 A * 1/1995 Loo et al. ...................... 174/252
5,870,823 A * 2/1999 Bezama et al. ................ 29/848
6,820,684 B1 11/2004 Chu et al.
6,975,027 B2 * 12/2005 Farrar et al. .................. 257/712
7,015,572 B2 * 3/2006 Yamaji ......................... 257/686
7,139,172 B2 11/2006 Bezama et al.
7,230,334 B2 6/2007 Andry et al.
7,432,592 B2 * 10/2008 Shi et al. ...................... 257/714
7,466,732 B2 12/2008 Stephens, IV
RE40,618 E 1/2009 Nelson et al.
7,560,813 B2 * 7/2009 Trezza ......................... 257/714
7,592,697 B2 * 9/2009 Arana et al. .................. 257/714
7,795,726 B2 * 9/2010 Myers et al. .................. 257/714
2008/0066888 A1 3/2008 Tong et al.
2009/0108435 A1 4/2009 Bernstein et al.
2009/0251862 A1 * 10/2009 Knickerbocker et al. ..... 361/699
2009/0308578 A1 12/2009 Bernstein et al.
2009/0311826 A1 12/2009 Bernstein et al.
2010/0117209 A1 * 5/2010 Bezama et al. ............... 257/686

OTHER PUBLICATIONS

Chen et al., Direct Liquid Cooling of a Stacked MCM, 2004 Inter Society Conference on Thermal Phenomena, pp. 199-206.
Dang et al., Integrated Thermal-Fluidic I/O Interconnects for an On-Chip Microchannel Heat Sink, IEEE Electron Device Letters, vol. 27, No. 2, Feb. 2006, pp. 117-119.
Sekar et al., A 3D-IC Technology with Integrated Microchannel Cooling, 2008 IEEE, pp. 13-15.
Tan et al., Thermal and Hydraulic Design and Characterization of a Liquid-Cooled 3D Silicon Module, 2008 10th Electronics Packaging Technology Conference, pp. 350-354.

* cited by examiner

*Primary Examiner* — Boris L Chervinsky
(74) *Attorney, Agent, or Firm* — Ryan, Mason & Lewis, LLP

(57) ABSTRACT

A plurality of heat-dissipating electronic chips are arranged in a vertical chip stack. The electronic chips have electronic components thereon. A cold plate is secured to a back side of the chip stack. A silicon carrier sandwich, defining a fluid cavity, is secured to a front side of the chip stack. An inlet manifold is configured to supply cooling fluid to the cold plate and the fluid cavity of the silicon carrier sandwich. An outlet manifold is configured to receive the cooling fluid from the cold plate and the fluid cavity of the silicon carrier sandwich. The cold plate, the silicon carrier sandwich, the inlet manifold, and the outlet manifold are configured and dimensioned to electrically isolate the cooling fluid from the electronic components. A method of operating an electronic apparatus and a method of manufacturing an electronic apparatus are also disclosed. Single-sided heat removal with double-sided electrical input-output and double-sided heat removal with double-sided electrical input-output are also disclosed.

25 Claims, 10 Drawing Sheets

3001
HEAT EXCHANGER
3003
320
302
304
306
308
310
312
314
322
387
324
327
391
389
325
316
3999

HEAT EXCHANGER
3001
3003
320
302
304
306
308
310
312
314
316
320
325
322
387
324
327
324
389
391
3999

304
308
314
302

304
308
314
302

DOUBLE-FACE HEAT REMOVAL OF VERTICALLY INTEGRATED CHIP-STACKS UTILIZING COMBINED SYMMETRIC SILICON CARRIER FLUID CAVITY AND MICRO-CHANNEL COLD PLATE

FIELD OF THE INVENTION

The present invention relates to the electronic and thermal arts, and, more particularly, to thermal control of electronics.

BACKGROUND OF THE INVENTION

A major challenge in vertically integrated high-performance chip stack packages is their thermal management. With reference to FIG. 1, the heat flux and thermal resistance accumulate with each additional tier, or chip layer 102. Back-side heat removal with attached air cooled heat sinks or high performance micro-channel cold plates 104 similar to conventional single chip packages is possible but very limited. This is because their heat removal capability does not scale with the number of stacked dies 102 and therefore limits the possible heat flux and the number of tiers 102 in the stack. Referring now to FIG. 2, interlayer-cooling is another cooling technology, which does scale with the number of tiers 102, but is very challenging to implement. Furthermore, interlayer-cooling limits the possible interconnect density to a 50 micron pitch or more for large chips.

SUMMARY OF THE INVENTION

Principles of the present invention provide techniques for double-face heat removal of vertically integrated chip-stacks utilizing a combined symmetric silicon carrier fluid cavity and micro-channel cold plate. In one aspect, an exemplary apparatus includes a plurality of heat-dissipating electronic chips arranged in a vertical chip stack. The electronic chips have electronic components thereon. Also included are a cold plate secured to a back side of the chip stack; a silicon carrier sandwich, defining a fluid cavity, secured to a front side of the chip stack; an inlet manifold configured to supply cooling fluid to the cold plate and the fluid cavity of the silicon carrier sandwich; and an outlet manifold configured to receive the cooling fluid from the cold plate and the fluid cavity of the silicon carrier sandwich. The cold plate, the silicon carrier sandwich, the inlet manifold, and the outlet manifold are configured and dimensioned to electrically isolate the cooling fluid from the electronic components.

In another aspect, an exemplary method of operating an electronic apparatus includes the step of providing an apparatus including a plurality of heat-dissipating electronic chips arranged in a vertical chip stack (the electronic chips have electronic components thereon); a cold plate secured to a back side of the chip stack; a silicon carrier sandwich, defining a fluid cavity, secured to a front side of the chip stack; an inlet manifold in fluid communication with the cold plate and the fluid cavity of the silicon carrier sandwich; and an outlet manifold in fluid communication with the cooling fluid from the cold plate and the fluid cavity of the silicon carrier sandwich. The cold plate, the silicon carrier sandwich, the inlet manifold, and the outlet manifold are configured and dimensioned to electrically isolate the cooling fluid from the electronic components. Further steps include providing chilled cooling fluid to the inlet manifold; and exhausting heated cooling fluid from the outlet manifold.

In still another aspect, an exemplary method of manufacturing an electronic apparatus includes the steps of providing a plurality of heat-dissipating electronic chips arranged in a vertical chip stack (the electronic chips have electronic components thereon); securing a cold plate to a back side of the chip stack; securing a silicon carrier sandwich, defining a fluid cavity, to a front side of the chip stack; assembling an inlet manifold to the cold plate and the silicon carrier sandwich in fluid communication with the cold plate and the fluid cavity of the silicon carrier sandwich; and assembling an outlet manifold to the cold plate and the silicon carrier sandwich in fluid communication with the cold plate and the fluid cavity of the silicon carrier sandwich.

In yet another aspect, an exemplary apparatus includes a plurality of heat-dissipating electronic chips arranged in a vertical chip stack. The electronic chips have electronic components thereon. Also included is a silicon carrier sandwich, defining a fluid cavity, secured to a front side of the chip stack. In an inlet manifold is configured to supply cooling fluid to the fluid cavity of the silicon carrier sandwich, and an outlet manifold is configured to receive the cooling fluid from the fluid cavity of the silicon carrier sandwich. A first series of electrical interconnects are on a side of the silicon carrier sandwich opposite the chip stack. A second series of electrical interconnects are on a back side of the chip stack. The silicon carrier sandwich, the inlet manifold, and the outlet manifold are configured and dimensioned to electrically isolate the cooling fluid from the electronic components.

As used herein, "facilitating" an action includes performing the action, making the action easier, helping to carry the action out, or causing the action to be performed.

These and other features, aspects and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
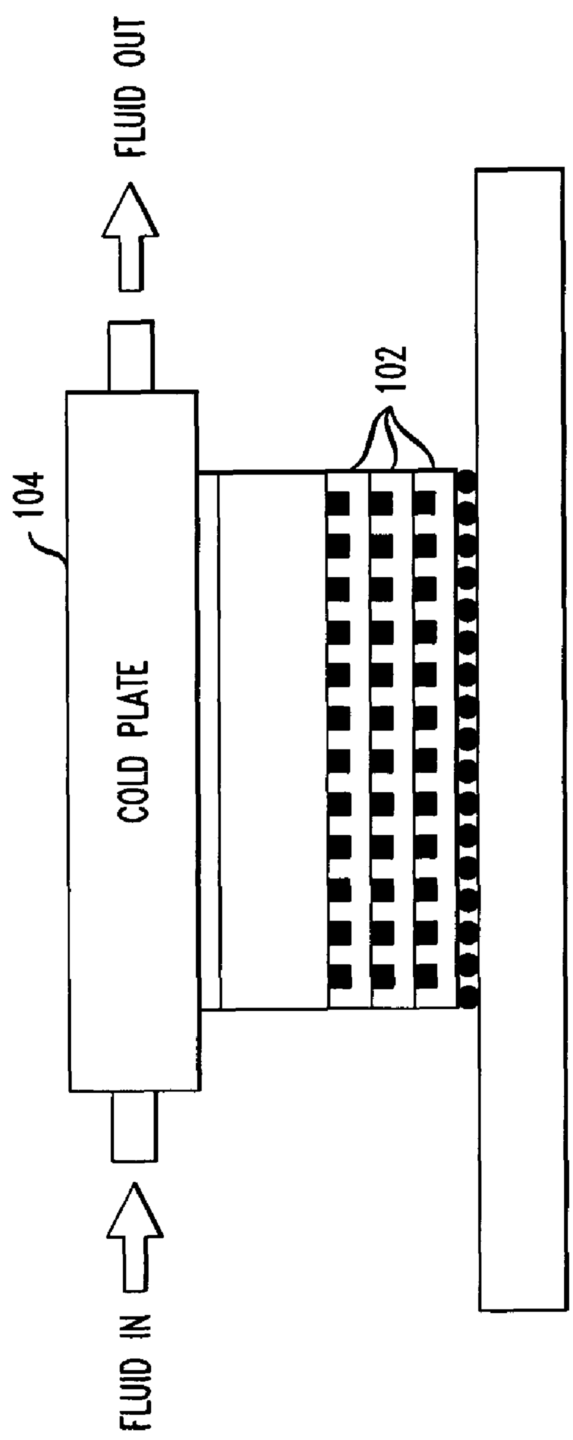
FIG. 1 shows a back-side-cooled 3-D package, according to the prior art.
Figure 2:
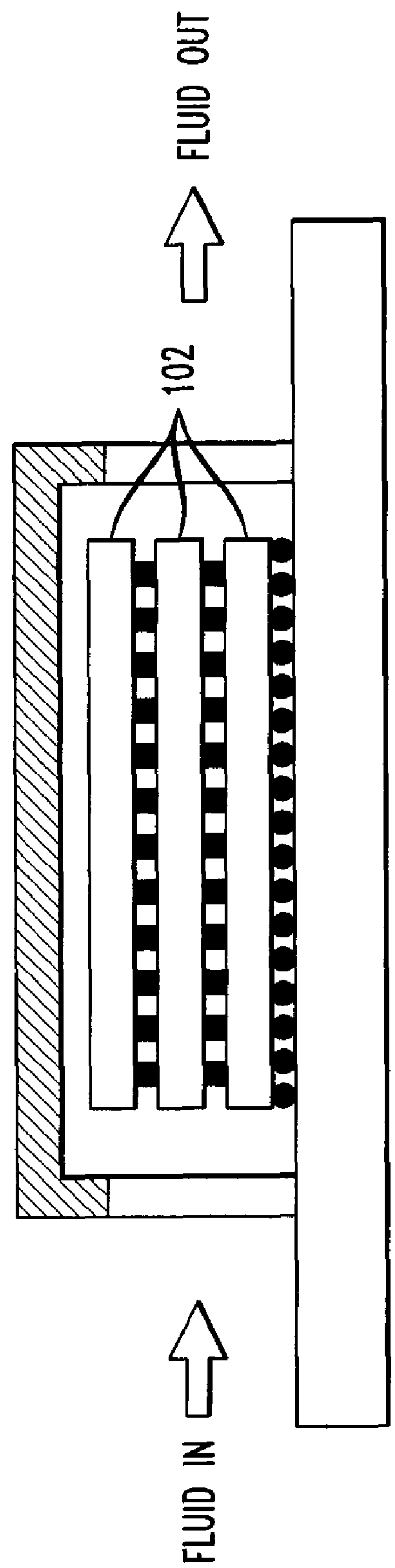
FIG. 2 shows convective interlayer heat removal, according to the prior art.

One or more embodiments of the invention provide double-face stack cooling utilizing the silicon-carrier and a back-side cold plate as heat absorbers, advantageously combining the strength of the mentioned technologies at moderate complexity. Front-side cooling using dielectric fluids pumped through the C4 (Controlled Collapse Chip Connection) ball array has already been proposed. However, limited heat removal capability is attained due to the poor thermo-physical properties of these coolants, especially in low height cavities, resulting in low heat flux capacity. The use of the superior thermal properties of water was not possible due to electro corrosion and shorting between solder balls. With the symmetric silicon-carrier fluid cavity, according to one or more embodiments of the invention, the electrical inputs and outputs (I/Os) are insulated from the coolant, and therefore water can be used. The industry calls these electrical interconnects "through silicon vias" (TSV).

In one or more embodiments, to double the heat removal capacity in thermally limited chip-stacks, both sides of the stack are considered for heat transfer, as compared to back-side cooling only. At the backside a micro-channel cold plate is applied. It connects to a symmetric silicon-carrier fluid cavity. Compared to interlayer cooling, the complexity is drastically reduced since no fluid has to be pumped through active layers with high interconnect density. The moderate pitch of 100 to 200 microns and a symmetric combination of two silicon carriers result in a large enough fluid cavity with acceptable mass flow rate. At the same time, the warp of the silicon carrier, which in an asymmetric configuration causes difficulties during micro-bump bonding, is eliminated. The result is a higher degree of freedom in chip stack design, especially in number of tiers and heat flux levels at minimal complexity; and the reduction of silicon carrier warp, increasing packaging yield. Further, the fluid connections to the silicon carrier can be provided from the back side cooler, rather than from the PCB.

In one or more embodiments, a plurality of heat-dissipating electronic chips are arranged in a vertical chip stack and mounted on a silicon carrier sandwich containing defined fluid cavities as well as electrically isolated through-silicon vias (TSVs). Two-sided chip stack cooling is achieved by employing a cold plate secured to a back side of the chip stack, as well as by the silicon carrier sandwich secured to the front (bottom or package) side of the chip stack. An inlet manifold is configured to supply cooling fluid to both the cold plate and the fluid cavity of the silicon carrier sandwich, while an outlet manifold is configured to receive the cooling fluid from both the cold plate and the fluid cavity of the silicon carrier sandwich. The TSVs are constructed such that electrical signals, power and ground connections are effectively made from an underlying substrate or package to the chip stack above, but in such a way that all connections are electrically isolated from the cooling fluid flowing within the silicon carrier sandwich. According to another aspect of the invention, the silicon carrier sandwich comprises upper and lower halves bonded together to form a stress-balanced symmetric sandwich with negligible warp or bow. According to still another aspect of the invention, the plurality of TSVs form pin fins within the fluid cavity, which are configured to conduct heat from the chip stack into the cooling fluid.

Figure 3:
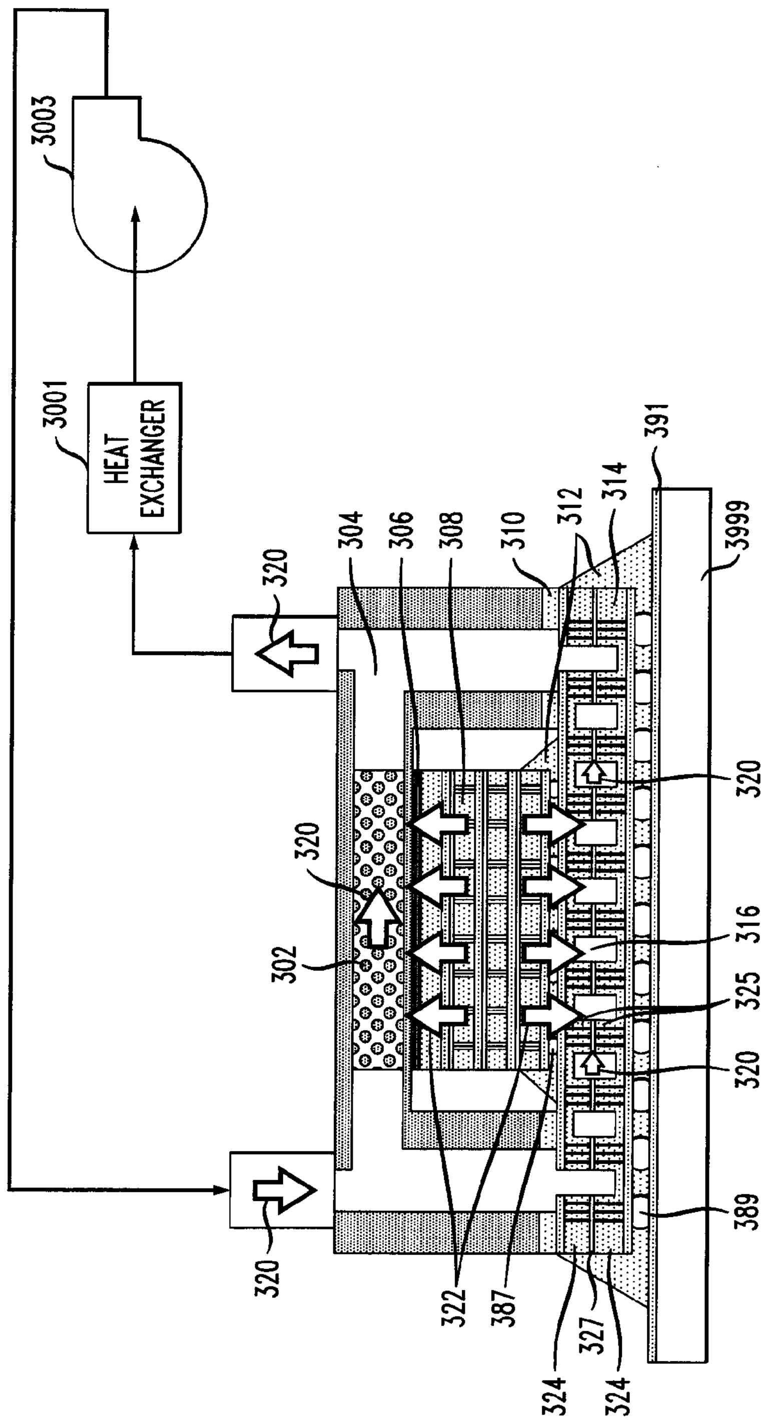
FIG. 3 shows a cross-section through an exemplary double-face cooled package, according to an aspect of the invention.
Figure 4:
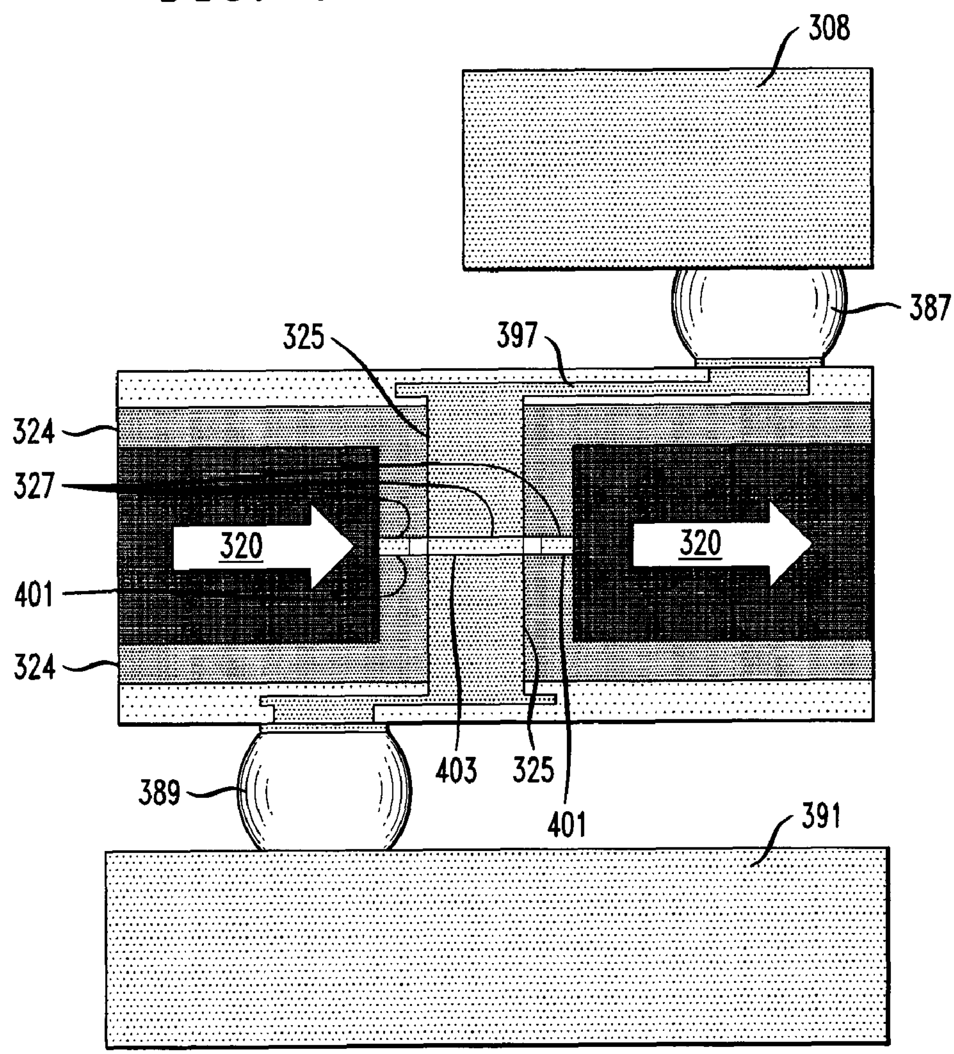
FIG. 4 depicts details of silicon carrier bonding technology, according to another aspect of the invention.

FIG. 3 is a cross-section through an exemplary embodiment of a double-face cooled package. FIG. 4 depicts details of silicon carrier bonding technology. Like elements have the same number. Arrows 320 indicate coolant flow, while arrows 322 represent heat flux. Two silicon carriers 324 with etched channel or pin-fin structures 325 are bonded with thin film solder 327 back-to-back and form a symmetric silicon carrier sandwich 314 with a fluid cavity 316. As will be seen in FIG. 5, pin fins 325 or microchannels 5999 permit passage of cooling fluid, as best seen in the top plan view of that figure.

The thin film solder pattern forms an insulation ring 401 (i.e., in one sense, fluid integrity insulation not electrical insulation; note, however, the ring prevents the fluid from reaching the pad, thus providing fluid sealing to prevent electrical shorts) to seal the electrical interconnect (the electrical bonding pad 403) off from the coolant, as best seen in FIG. 4. This allows the use of water as the heat transport fluid. The pitch range of the through silicon vias (TSV) (which form the pin fins 325) is, for example, 100 to 200 microns with a TSV height of, for example, 75 to 150 microns per side. The total cavity height can be, for example, 100 to 200 microns. Note that in one or more embodiments the TSV height must exceed the cavity height to have enough residual silicon thickness to form the cavity capable to support the fluid pressure. The symmetric configuration of the silicon carrier sandwich 314 results in minimal warp and increases yield during ball grid array bonding.

A silicon or metal back-side cold plate 302 is attached to the chip stack 308 (a four-tier stack is shown for illustrative purposes) using a thermal interface material (TIM) 306. The integrated manifold 304 delivers fluid to the front and back-side heat removal cavities. To reduce mechanical stress from thermal mismatch in case of a metal cold plate, an elastic polymer gasket 310 is used. The front-side fluid inlet and outlet are spatially separated from the micro-C4 array of solder balls 387 to prevent moisture diffusion through the underfill epoxy 312 causing electro-corrosion. This double face cold plate concept nearly doubles the heat removal from a vertical integrated chip stack. Note that array 387 may have, for example, a 30-100 micron pitch.

Note C4 array 389 which is used to attach the above structure to laminate 391, 3999 (array 389 may have, for example, a 150-200 micron pitch). The laminate 391, 3999 could be, for example, an organic build-up substrate or a ceramic single or multi-chip module. Both portion 391 and portion 3999 represent the laminate—portion 391 is the wiring layers and portion 3999 is additional wiring layers. In one or more embodiments, the laminate is a multi-layer organic build-up substrate, with or without a core. An additional underfill layer 312 is applied to protect the C4s between the laminate 391, 3999 and the symmetric silicon carrier sandwich 314. This may, or may not, be the same underfill material 312 as is used between the symmetric silicon carrier sandwich 314 and the chip stack 308. Note that redistribution wiring layer or layer(s) 397 is provided on the surface of the silicon carrier sandwich which is adjacent to the vertical chip stack 308 to transform between the larger pitch electrical connections on the bottom (laminate side) of the silicon carrier sandwich to the smaller pitch electrical connections on the top (vertical chip stack side) of the silicon carrier sandwich.

Figure 5:
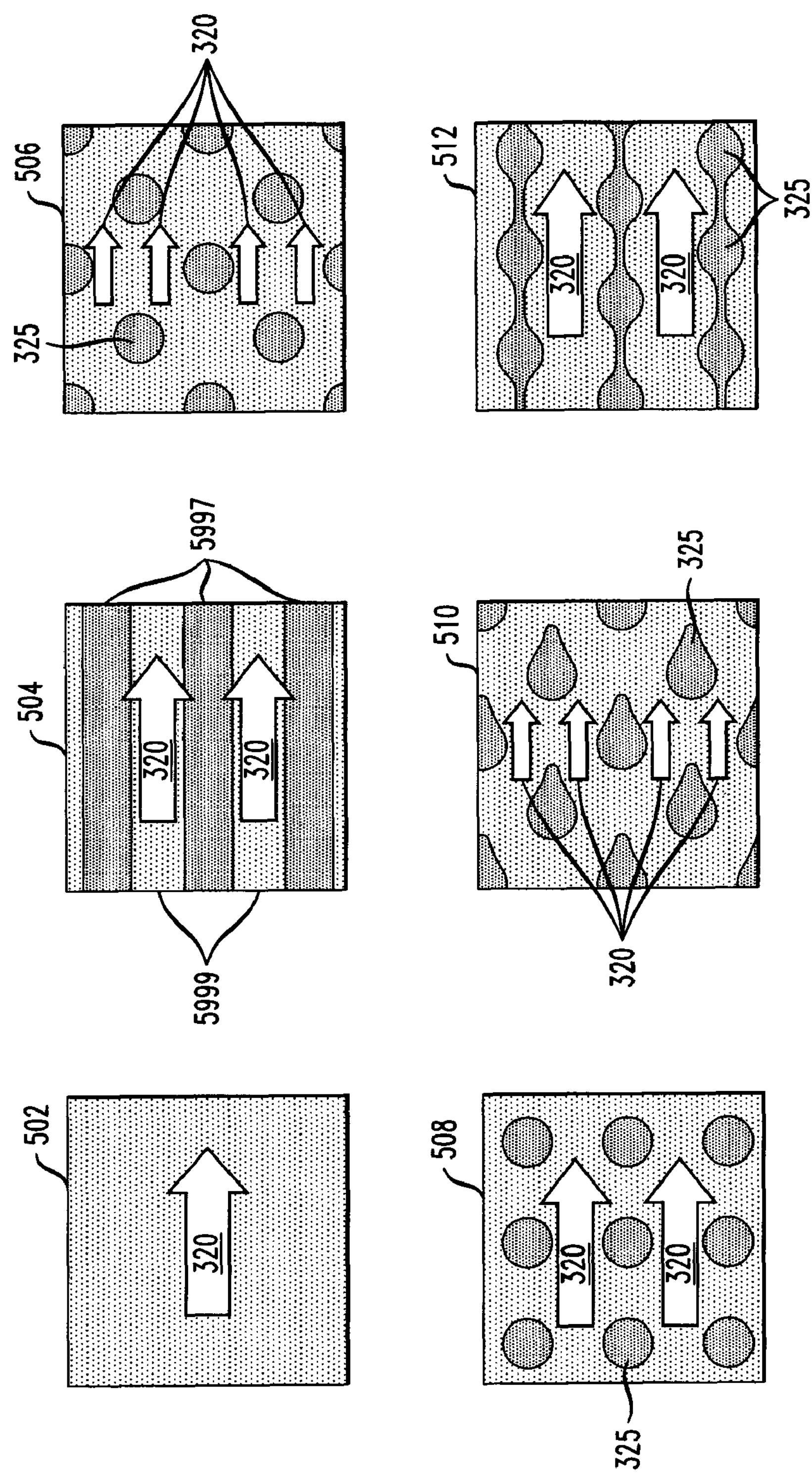
FIG. 5 depicts potential fluid cavity structures compatible with through-silicon vias (TSV), according to yet another aspect of the invention.

FIG. 5 shows exemplary fluid cavity structures compatible with TSV. These include two different arrangements of circular pin fins as shown at 506, 508, as well as drop-shaped pin fins as shown at 510. Other types of structures include conventional plate fins 5997 forming micro-channels 5999, as at 504, and "connected" pin fins forming roughened micro-channels as at 512. An open chamber with no fins could also be used (at least in part), as at 502; this would result in lower pressure drop of the cooling fluid at the expense of reduced heat transfer and IO-number. Furthermore the mechanical integrity has to be carefully considered in this case due to reduced number of mechanical stiffening pins.

Figure 6:
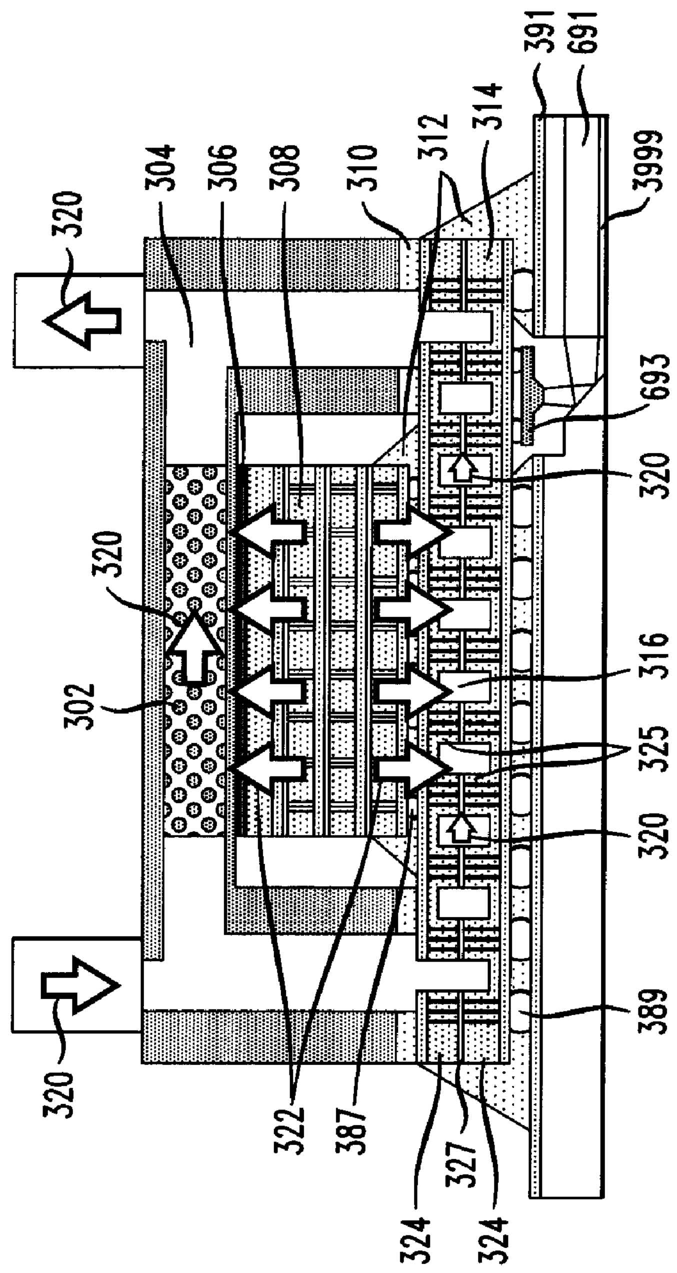
FIG. 6 shows a cross-section through another exemplary double-face cooled package, similar to that in FIG. 3, but with embedded optical communication, according to still another aspect of the invention.

FIG. 6 shows a cross-section through another exemplary double-face cooled package, similar to that in FIG. 3, but with embedded optical communication. Elements similar to those in FIGS. 3 and 4 have received the same reference character and will not be described again. Embedded optical technologies such as on-package silicon-photonics and embedded optical off-package communication are sensitive to elevated temperatures and their variations. Double-face cooling decreases absolute temperatures and temperature variations and gradients in the chip-stack significantly. Furthermore, the silicon carrier can serve as a thermal ground plane for a vertical-cavity surface-emitting laser (VCSEL) 693 with embedded wave guide 691.

It should be noted that the skilled artisan will be familiar with the formation of through-wafer vias, and given the teachings herein, will be able to use through-wafer via technology to make one or more embodiments of the invention. Nevertheless, out of an abundance of caution, the complete disclosure of co-assigned U.S. Patent Publication 2008-0274583 of Andry et al., entitled "Through-Wafer Vias," published on Nov. 6, 2008, is expressly incorporated herein by reference in its entirety for all purposes; the complete disclosure of co-assigned U.S. Patent Publication 2005-0121768 of Edelstein et al., entitled "Silicon chip carrier with conductive through-vias and method for fabricating same," published on Jun. 9, 2005, is expressly incorporated herein by reference in its entirety for all purposes; and the complete disclosure of co-assigned U.S. Pat. No. 7,488,680 of Andry et al., entitled "Conductive Through Via Process for Electronic Device Carriers," issued Feb. 10, 2009, is also expressly incorporated herein by reference in its entirety for all purposes.

One or more embodiments of the invention advantageously allow use of water as the cooling fluid, since there is no contact between the cooling fluid and electrical inputs and outputs; thus, the embodiments are not limited to dielectric cooling. The water may be supplied by a pump 3003 and routed to an external heat exchanger 3001 to reject the heat gained in passing through the silicon fluid cavity and micro-channel cold plate.

One or more embodiments of the invention advantageously allow use of solid TSVs which conduct heat from the chip stack; these TSVs function as pin-fins within the fluid cavity 316 and do not themselves need to serve as pipes for the cooling fluid.

The chip stack can be fabricated using a variety of known techniques. In at least some instances, no fluid-carrying structure needs to be interposed between the adjacent chips. Furthermore, another advantage of one or more embodiments is reduced bowing due to the silicon carrier sandwich.

Figure 7:
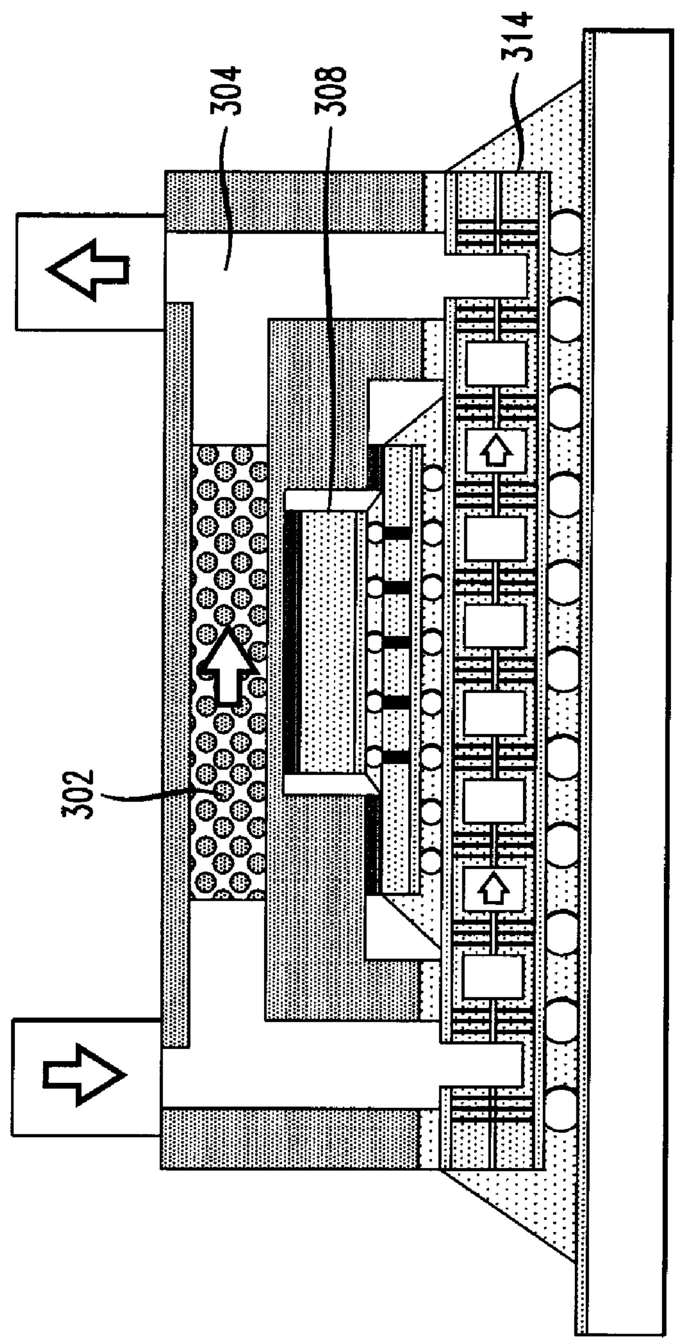
FIGS. 7-10 show cross-sectional views of various alternative embodiments, including, respectively, double-faced heat removal with single-sided input/output, double-faced heat removal with double-sided input/output, single-faced heat removal with double-sided input/output, and double-faced heat removal with double-sided input/output.
Figure 8:
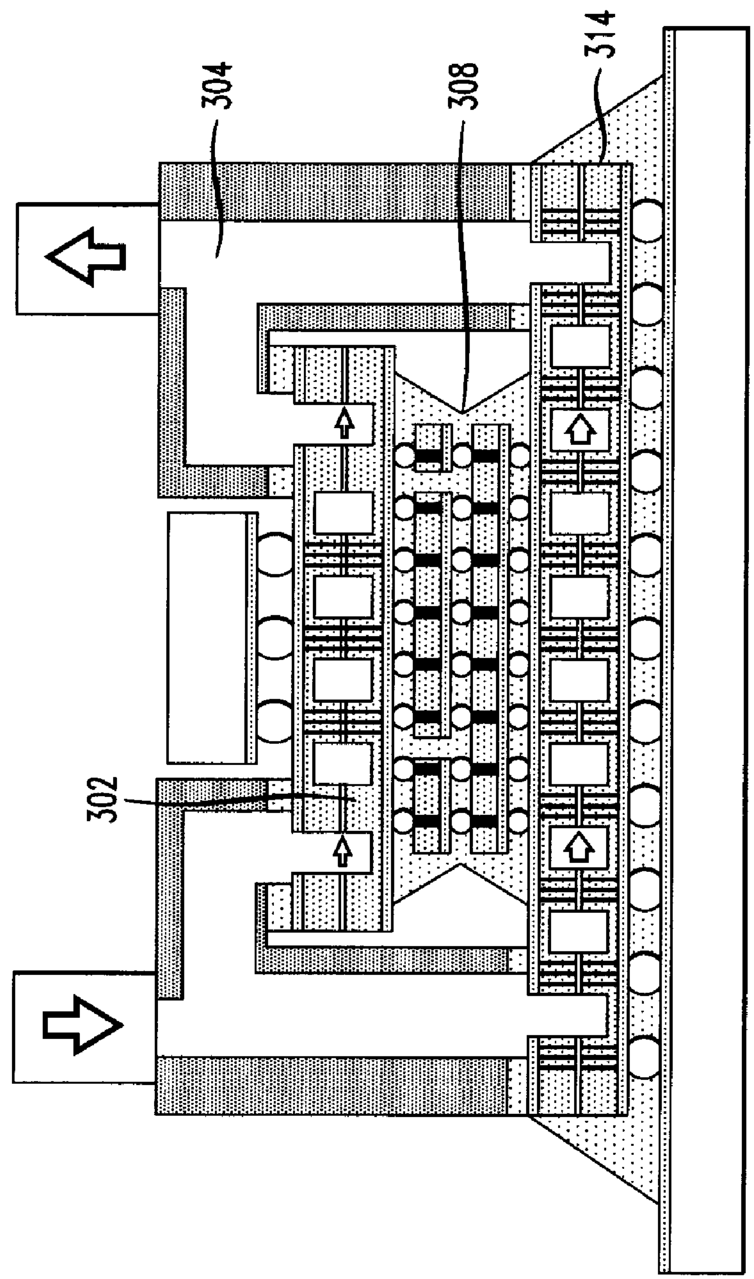

A wide variety of alternatives are possible. FIGS. 7-10 show cross-sectional views of various alternative embodiments. Like elements have received the same reference characters. FIG. 7 shows double-faced heat removal with single-sided input/output, similar to FIGS. 3 and 6. FIG. 8 shows double-faced heat removal with double-sided input/output. Here, the back-side cold plate is itself a (silicon, e.g.) carrier sandwich.

Figure 9:
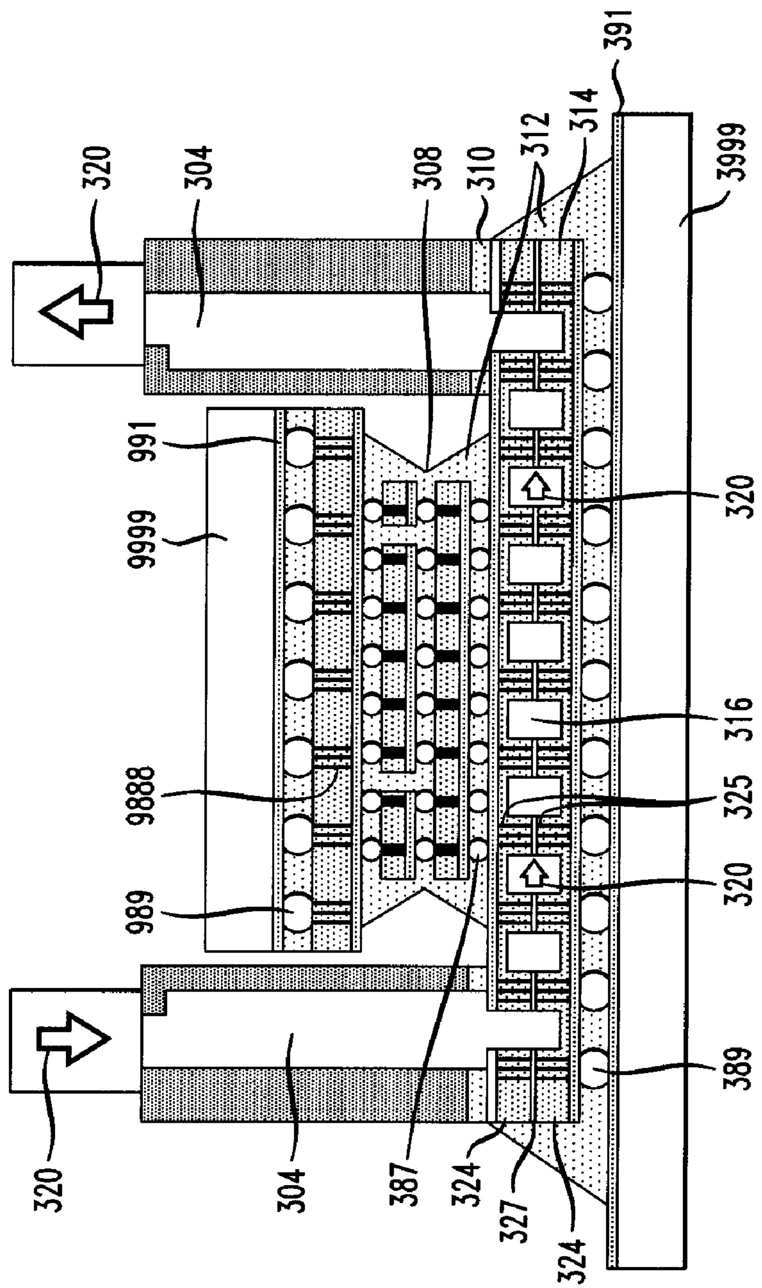

FIG. 9 shows single-faced heat removal with double-sided input/output; there is no back side cold plate and a separate inlet and outlet manifold may be employed, for example. On the back side note elements 989 similar to elements 389, vias 9888, and laminate 991, 9999 which could be similar, for example, to laminate 391, 3999 as described above. Other elements can be constructed and arranged in a manner analogous to that described for the other figures.

Figure 10:
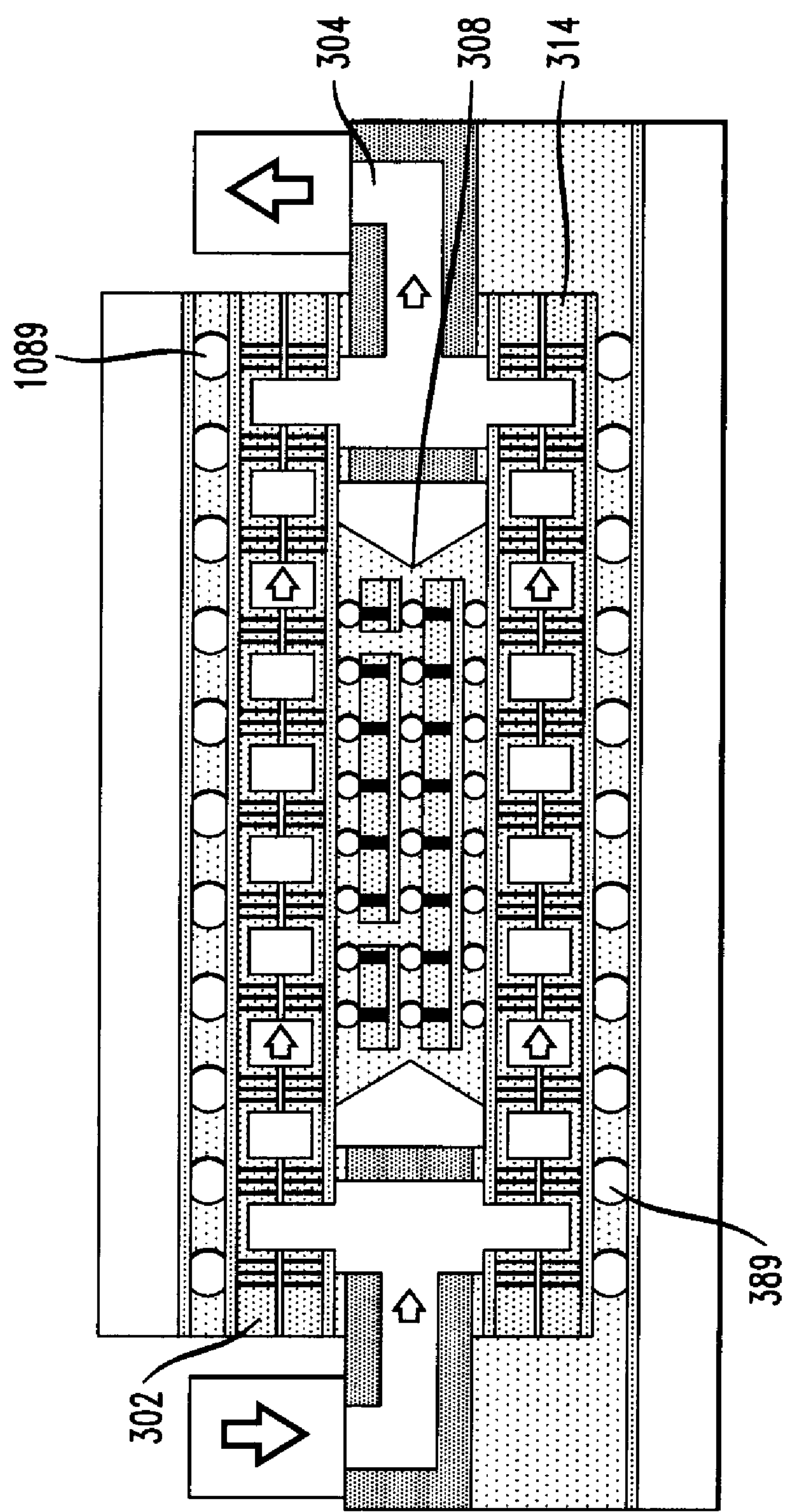

FIG. 10 shows double-faced heat removal with double-sided input/output. Here, the back-side cold plate is again itself a (silicon, e.g.) carrier sandwich.

Given the discussion thus far, it will be appreciated that, in general terms, an exemplary apparatus, according to an aspect of the invention, includes a plurality of heat-dissipating electronic chips arranged in a vertical chip stack 308. The electronic chips have electronic components thereon. A cold plate 302 is secured to a back side of the chip stack 308. Cold plate 302 may be a metal or silicon cold plate, for example, and in some instances may itself be realized as a (silicon) carrier sandwich. A silicon carrier sandwich 314 defines a fluid cavity 316 and is secured to a front side of the chip stack 308. An inlet manifold (e.g., left hand side of manifold 304) is configured to supply cooling fluid to the cold plate 302 and the fluid cavity 316 of the silicon carrier sandwich 314. An outlet manifold (e.g., right hand side of manifold 304) is configured to receive the cooling fluid from the cold plate 302 and the fluid cavity 316 of the silicon carrier sandwich 314. The cold plate 302, the silicon carrier sandwich 314, the inlet manifold, and the outlet manifold (e.g., integrated manifold 304) are configured and dimensioned to electrically isolate the cooling fluid from the electronic components (for example, as seen in FIG. 4).

Preferably, the silicon carrier sandwich 314 includes upper and lower halves 324 bonded together (e.g., with solder 327). In some instances, the silicon carrier sandwich further includes a plurality of pin fins within the fluid cavity 316, these pin fins 325 may optionally include through-silicon vias. The pin fins are configured to conduct heat from the chip stack 308 into the cooling fluid (see arrows 322). As seen in FIG. 5, the pin fins may have a circular cross section, as at 506, 508; or the pin fins may have a drop-shaped cross section, as at 510. As seen at 508, the pin fins can be arranged in uniform columns; in other cases, as seen at 506, the pin fins can be arranged in staggered columns. By way of example and not limitation, the pin fins may have a pitch of from about 100 to 200 microns and a height of from about 100 to 200 microns.

In other instances, the silicon carrier sandwich 314 further includes a plurality of plate fins within the fluid cavity, configured to conduct heat from the chip stack into the cooling fluid, as seen at 504 and 512.

As noted, pump 3003 may be provided to pump the cooling fluid, and an external heat exchanger 3001 may be coupled to the pump, the inlet manifold, and the outlet manifold, to cool the cooling fluid via heat transfer to an external sink (e.g., ambient air, another liquid, and the like).

In some instances, at least one laminate structure 391, 3999 is secured to the silicon carrier sandwich 314. The laminate structure 391 further may be a first level package substrate which is subsequently attached to a larger circuit board using a BGA or LGA array. As discussed below, this may be carried out by securing element 391 to sandwich 314 with C4 array 389, sandwich 314 in turn being secured to front side of stack 308 with micro C4 solder balls 387. In some cases, at least one optical component is embedded in the laminate structure (see, e.g., discussion of vertical-cavity surface-emitting laser (VCSEL) 693 with embedded wave guide 691).

Furthermore, given the discussion thus far, it will be appreciated that, in general terms, an exemplary method of manufacturing an electronic apparatus, according to another aspect of the invention, includes providing a plurality of heat-dissipating electronic chips arranged in a vertical chip stack 308. The electronic chips have electronic components thereon. An additional step includes securing a cold plate 302 to a back side of the chip stack 308. A further step includes securing a silicon carrier sandwich 314, defining a fluid cavity 316, to a front side of the chip stack 308.

Additional steps include assembling an inlet manifold (e.g., left hand side of 304) to the cold plate 302 and the silicon carrier sandwich 314 in fluid communication with the cold plate and the fluid cavity 316 of the silicon carrier sandwich; and assembling an outlet manifold (e.g., right hand side of 304) to the cold plate and the silicon carrier sandwich in fluid communication with the cold plate and the fluid cavity of the silicon carrier sandwich. It will be appreciated that when a unitary manifold 304 is employed, these two assembling steps are normally carried out simultaneously.

A further step can include bonding upper and lower halves 324 of the silicon carrier sandwich together to form the silicon carrier sandwich (e.g., with solder, or other conductive joining material, 327). A still further step can include forming a plurality of through-silicon vias as pin fins 325 within the fluid cavity 316, configured to conduct heat from the chip stack 308 into cooling fluid, as per arrows 322. Any of the configurations and dimensions of pin fins described can be used, for example. In other cases, an additional step includes forming a plurality of plate fins (see, e.g., 504, 512) within the fluid cavity 316, configured to conduct heat from the chip stack into cooling fluid.

In some instances, an additional step includes securing at least one laminate structure 391, 3999 to the silicon carrier sandwich 314. As shown in the non-limiting example in the figures, this may be carried out by securing element 391 to sandwich 314 with C4 array 389, sandwich 314 in turn being secured to front side of stack 308 with micro-C4 solder balls 387. As best seen in FIG. 6, an additional step can include embedding at least one optical component in the silicon carrier sandwich.

Yet further, given the discussion thus far, it will be appreciated that, in general terms, an exemplary method of operating an electronic apparatus, according to another aspect of the invention, includes providing an apparatus of the kind described, providing chilled cooling fluid to the inlet manifold; and exhausting heated cooling fluid from the outlet manifold.

In still another aspect, and with reference again to FIG. 9, an exemplary apparatus includes a plurality of heat-dissipating electronic chips arranged in a vertical chip stack 308. The electronic chips have electronic components thereon. Also included is a silicon carrier sandwich 314, defining a fluid cavity 316, secured to a front side of the chip stack 308. In an inlet manifold (left side of 304) is configured to supply cooling fluid to the fluid cavity of the silicon carrier sandwich, and an outlet manifold (right side of 304) is configured to receive the cooling fluid from the fluid cavity of the silicon carrier sandwich. A first series of electrical interconnects 389 are on a side of the silicon carrier sandwich 314 opposite the chip stack 308. A second series of electrical interconnects 989 are on a back side of the chip stack 308. The silicon carrier sandwich 308, the inlet manifold (304 left side), and the outlet manifold (304 right side) are configured and dimensioned to electrically isolate the cooling fluid from the electronic components. In some embodiments, the silicon carrier sandwich 308 comprises upper and lower halves bonded together, as in FIG. 4 and a plurality of fins within the fluid cavity, configured to conduct heat from the chip stack into the cooling fluid. Any of the different kinds of fins described herein can be employed.

In yet another aspect, with reference again to FIG. 10, double-sided heat removal with double-sided electrical input-output is also possible. Here, said silicon carrier sandwich 314 is first silicon carrier sandwich and said cold plate 302 is a second silicon carrier sandwich. A first series of electrical interconnects 389 are on a side of said first silicon carrier sandwich opposite said chip stack. A second series of electrical interconnects 1089 are on a side of said second silicon carrier sandwich opposite said chip stack.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:

a plurality of heat-dissipating electronic chips arranged in a vertical chip stack, said electronic chips having electronic components thereon;

a cold plate secured to a back side of said chip stack;

a silicon carrier sandwich, defining a fluid cavity, secured to a front side of said chip stack;

an inlet manifold configured to supply cooling fluid to said cold plate and said fluid cavity of said silicon carrier sandwich; and an outlet manifold configured to receive said cooling fluid from said cold plate and said fluid cavity of said silicon carrier sandwich;

wherein said cold plate, said silicon carrier sandwich, said inlet manifold, and said outlet manifold are configured and dimensioned to electrically isolate said cooling fluid from said electronic components.

2. The apparatus of claim 1, wherein said silicon carrier sandwich comprises upper and lower halves bonded together.

3. The apparatus of claim 2, wherein said silicon carrier sandwich further comprises a plurality of pin fins within said fluid cavity, configured to conduct heat from said chip stack into said cooling fluid.

4. The apparatus of claim 3, wherein said pin fins have a circular cross section.

5. The apparatus of claim 3, wherein said pin fins have a drop-shaped cross section.

6. The apparatus of claim 3, wherein said pin fins are arranged in uniform columns.

7. The apparatus of claim 3, wherein said pin fins are arranged in staggered columns.

8. The apparatus of claim 3, wherein said pin fins have a pitch of from about 100 to 200 microns and a height of from about 100 to 200 microns.

9. The apparatus of claim 2, wherein said silicon carrier sandwich further comprises a plurality of plate fins within said fluid cavity, configured to conduct heat from said chip stack into said cooling fluid.

10. The apparatus of claim 2 wherein said silicon carrier sandwich has a surface adjacent said vertical chip stack, further comprising redistribution wiring provided on said surface of said silicon carrier sandwich adjacent said vertical chip stack.

11. The apparatus of claim 1, further comprising:

a pump to pump said cooling fluid; and an external heat exchanger coupled to said pump, said inlet manifold, and said outlet manifold, to cool said cooling fluid via heat transfer to an external sink.

12. The apparatus of claim 1, further comprising:

at least one laminate structure secured to said silicon carrier sandwich; and at least one optical component embedded in said laminate structure.

13. The apparatus of claim 1, wherein said silicon carrier sandwich comprises a first silicon carrier sandwich and said cold plate comprises a second silicon carrier sandwich, further comprising:

a first series of electrical interconnects on a side of said first silicon carrier sandwich opposite said chip stack; and a second series of electrical interconnects on a side of said second silicon carrier sandwich opposite said chip stack.

14. A method of operating an electronic apparatus, comprising:

providing an apparatus comprising:

a plurality of heat-dissipating electronic chips arranged in a vertical chip stack, said electronic chips having electronic components thereon;

a cold plate secured to a back side of said chip stack;

a silicon carrier sandwich, defining a fluid cavity, secured to a front side of said chip stack;

an inlet manifold in fluid communication with said cold plate and said fluid cavity of said silicon carrier sandwich; and an outlet manifold in fluid communication with said cooling fluid from said cold plate and said fluid cavity of said silicon carrier sandwich;

wherein said cold plate, said silicon carrier sandwich, said inlet manifold, and said outlet manifold are configured and dimensioned to electrically isolate said cooling fluid from said electronic components;

providing chilled cooling fluid to said inlet manifold; and exhausting heated cooling fluid from said outlet manifold.

15. A method of manufacturing an electronic apparatus, comprising:

providing a plurality of heat-dissipating electronic chips arranged in a vertical chip stack, said electronic chips having electronic components thereon;

securing a cold plate to a back side of said chip stack;

securing a silicon carrier sandwich, defining a fluid cavity, to a front side of said chip stack;

assembling an inlet manifold to said cold plate and said silicon carrier sandwich in fluid communication with said cold plate and said fluid cavity of said silicon carrier sandwich; and assembling an outlet manifold to said cold plate and said silicon carrier sandwich in fluid communication with said cold plate and said fluid cavity of said silicon carrier sandwich.

16. The method of claim 15, further comprising bonding upper and lower halves of said silicon carrier sandwich together to form said silicon carrier sandwich.

17. The method of claim 16, further comprising forming a plurality of pin fins within said fluid cavity, configured to conduct heat from said chip stack into cooling fluid.

18. The method of claim 17, wherein, in said fin-forming step, said pin fins have at least one of a circular cross section and a drop-shaped cross section.

19. The method of claim 17, wherein, in said fin-forming step, said pin fins are arranged in uniform columns.

20. The method of claim 17, wherein, in said fin-forming step, said pin fins are arranged in staggered columns.

21. The method of claim 17, wherein, in said fin-forming step, said pin fins have a pitch of from about 100 to 200 microns and a height of from about 100 to 200 microns.

22. The method of claim 16, further comprising forming a plurality of plate fins within said fluid cavity, configured to conduct heat from said chip stack into cooling fluid.

23. The method of claim 15, further comprising:

securing at least one laminate structure to said silicon carrier sandwich; and embedding at least one optical component in said laminate structure.

24. An apparatus comprising:

a plurality of heat-dissipating electronic chips arranged in a vertical chip stack, said electronic chips having electronic components thereon;

a silicon carrier sandwich, defining a fluid cavity, secured to a front side of said chip stack;

an inlet manifold configured to supply cooling fluid to said fluid cavity of said silicon carrier sandwich;

an outlet manifold configured to receive said cooling fluid from said fluid cavity of said silicon carrier sandwich;

a first series of electrical interconnects on a side of said silicon carrier sandwich opposite said chip stack; and a second series of electrical interconnects on a back side of said chip stack;

wherein said silicon carrier sandwich, said inlet manifold, and said outlet manifold are configured and dimensioned to electrically isolate said cooling fluid from said electronic components.

25. The apparatus of claim 24, wherein said silicon carrier sandwich comprises upper and lower halves bonded together and a plurality of fins within said fluid cavity, configured to conduct heat from said chip stack into said cooling fluid.

* * * * *